United States Patent [19]

Goldman

[11] Patent Number: 4,622,519
[45] Date of Patent: Nov. 11, 1986

[54] MULTI-CHANNEL DATA SIGNAL COMBINING ARRANGEMENT

[75] Inventor: Joel Goldman, Randolph, N.J.

[73] Assignee: AT&T Bell Laboratories, Murray Hill, N.J.

[21] Appl. No.: 497,980

[22] Filed: May 25, 1983

[51] Int. Cl.[4] .................. H04Q 3/00; H03K 5/22; H03K 17/00

[52] U.S. Cl. .................. 328/137; 328/116; 328/154

[58] Field of Search .............. 328/137, 143, 146, 147, 328/148, 149, 150, 154, 115, 116, 117; 307/355, 357; 340/660, 661, 870.27; 364/728, 734, 811, 819

[56] References Cited

U.S. PATENT DOCUMENTS

| | | | |
|---|---|---|---|
| 3,609,565 | 9/1971 | Arnold | 328/137 |
| 3,619,791 | 11/1971 | Moreines | 328/137 |
| 3,668,620 | 6/1972 | Mathieu | 340/15.5 |
| 3,704,444 | 11/1972 | Schmitt | 340/15.5 |
| 4,031,506 | 6/1977 | Siems | 328/137 |
| 4,202,048 | 5/1980 | Edwards | 367/40 |
| 4,257,043 | 3/1981 | Tsuchiko | 340/722 |
| 4,314,364 | 2/1982 | Bickel | 367/43 |
| 4,321,850 | 4/1982 | Oya et al. | 328/137 |
| 4,419,595 | 12/1983 | Reiner | 328/147 |

OTHER PUBLICATIONS

"ORing Loss Data for Square Law Detectors Followed by an ORing Device and an Accumulator," *J. Acoustical Society of America*, vol. 72, No. 1, Jul. 1982, W. A. Struzinski, pp. 191-195.

Primary Examiner—Stanley D. Miller
Assistant Examiner—Timothy P. Callahan
Attorney, Agent, or Firm—Joseph P. Kearns; Charles Scott Phelan

[57] ABSTRACT

An arrangement is shown for combining multisource randomly occurring data, such as seismic or sonar data, into a single output signal. Histories of simultaneously occurring data from each source are accumulated, and their power levels compared to determine which is likely to have significant data, as distinguished from noise. The largest of the data so compared in a given time epoch determines the source to be used in a succeeding epoch to provide the output contribution for that succeeding epoch.

8 Claims, 10 Drawing Figures

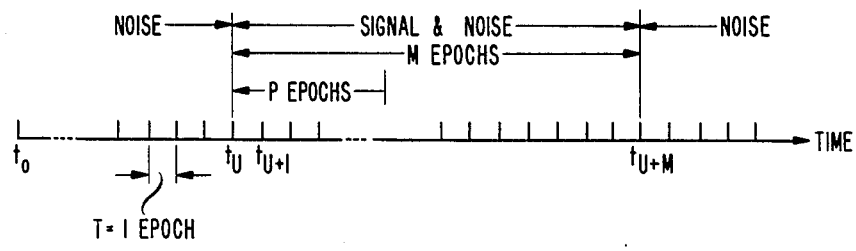
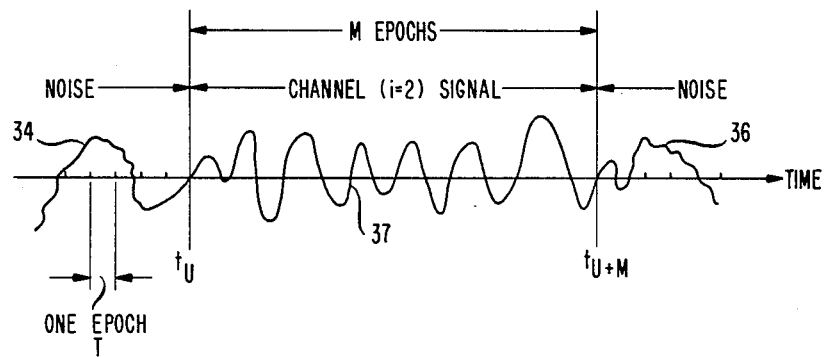
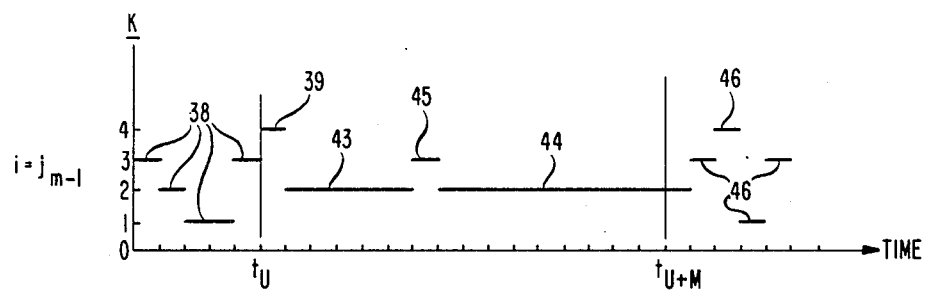

MULTI-CHANNEL DATA SIGNAL COMBINING ARRANGEMENT

FIELD OF THE INVENTION

This invention relates to data signal combining arrangements and, in particular, to arrangements for combining data signals from diverse sources.

BACKGROUND OF THE INVENTION

In certain situations, it is useful to combine data signals received over plural channels from different sources. Those sources usually individually provide such signals at unpredictable times and immersed in a background noise at a level close to that of the level of the data signals. Illustrative situations include seismic and sonar systems wherein masses of such data must be collected simultaneously from so many sources that it is burdensome for an individual operator to collate the data intelligently.

It is known to combine the signals from the respective channels onto a common output medium for monitoring. In the Tsuchiko U.S. Pat. No. 4,257,043, plural channel signals are combined as respective waveforms on a single cathode ray tube display. Combining by exclusive ORing is shown by W. A. Struzinski in "ORing Loss Data for Square Law Detectors Followed by an ORing Device and an Accumulator," *Journal of the Acoustical Society of America*, Vol. 72, No. 1, July 1982, pages 191-195. It has been found, however, that even after data is combined into a single output signal and displayed, it is sometimes difficult to evaluate because there is so much channel noise present that contrast is poor between the noise and the desired information signals.

SUMMARY OF THE INVENTION

According to the present invention, the signals occurring on a plurality of signaling channels are separately and recurrently averaged over successive periods which each includes multiple subintervals. An identifier of the channel having the greatest average at the end of a current subinterval is used in a subsequent subinterval to select for outputting the unaveraged signal from the identified channel.

In one embodiment, signal from each of a plurality of channels is received, and its power averaged over plural subintervals, or epochs, up to the end of a current epoch m. These average power levels are compared; and the strongest channel, i.e., the one with the largest level, is determined. Unaveraged signal in that largest-level channel, and occurring during the next epoch m+1, is selected for outputting. The channel with the largest averaged level is similarly determined in each succeeding epoch and its identifier used to select that channel to output its unaveraged signal in a following epoch.

BRIEF DESCRIPTION OF THE DRAWING

This invention will be more thoroughly appreciated from the following detailed description and the drawing in which:

FIG. 2 is a time diagram for facilitating description of the invention;

FIGS. 3 through 6 are waveforms of representative signals illustrating operation of the arrangement of FIG. 1;

DETAILED DESCRIPTION

Figure 1:
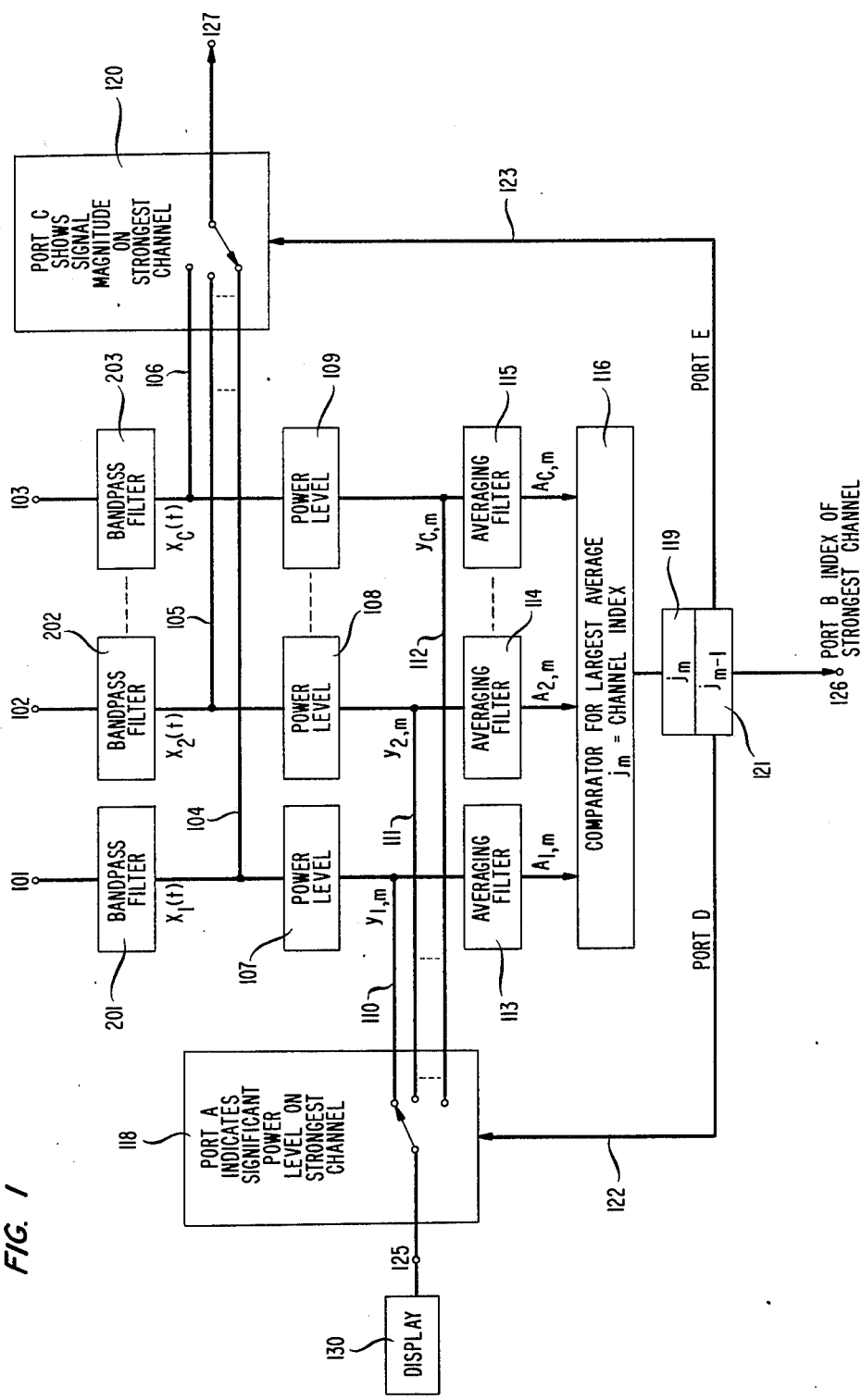
FIG. 1 is a block diagram of an arrangement for combining signals from a plurality of channels according to this invention.
Figure 9:
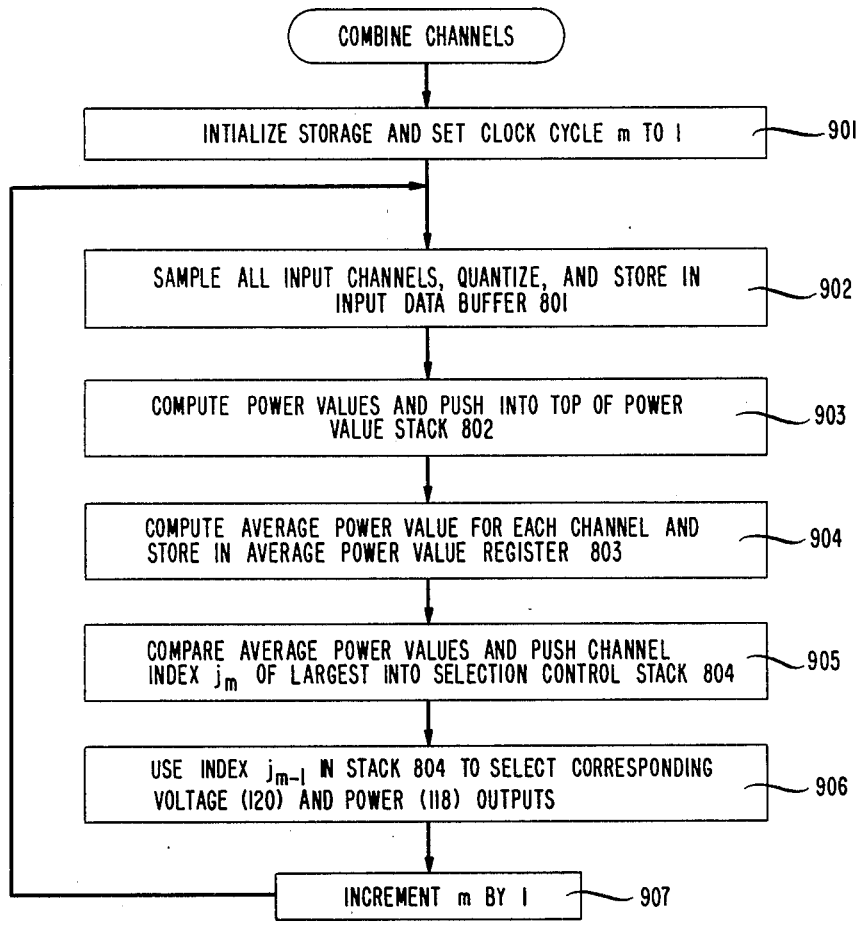
FIG. 9 is a process flow diagram illustrating an implementation of the invention using the arrangement of FIG. 7.

The present invention can be implemented in either a hardware or a computer-programmable process format, but the latter is presently considered to be the most advantageous and is the focus of this description. To that end, FIG. 1 is a functional block diagram illustrating an application of the invention to facilitate an understanding of the process implementation to be described. The process is illustrated in FIG. 9, and it is advantageously implemented using a general purpose digital computer, such as the 1108 computer of the Sperry Corporation. That computer receives the same input signals, and produces combined output signals, to be described in connection with FIG. 1; and it processes those input signals using the operations indicated in FIG. 9. All of those operations are individually well known in the art and, as such, individually comprise no part of the present invention.

In FIG. 1, the strongest of a plurality of information-bearing channels is selected on the basis of signal level averages, i.e., signal power level in the illustrative embodiment. FIG. 2 is a diagram of time relationships that will become evident as the description proceeds. The mentioned selection produces an identification of the particular channel selected, and that identification controls selection later of the channel which is to provide unaveraged signal output. The arrangement comprises input terminals 101, 102, and 103; power level monitoring circuits 107, 108, and 109; averaging filters 113, 114, and 115; comparator 116; selector 118; indexing stack 119, 121; selector 120; and output terminals 125, 126, and 127.

Input terminals, only three 101, 102, and 103 of which are actually shown, accept signals $x_1(t)$, $x_2(t)$, and $x_C(t)$, which, from time to time (and usually at different times), bear information from a plurality of sources (not shown). These sources and others can, by way of example, provide signals of a seismic or sonar nature. The signals on a given channel are electrical voltages from devices such as geophones or hydrophones, respectively coupled to terminals 101—103.

The normal background on a channel is random noise $n(t)$. It is assumed that, in the absence of an information signal, the average background noise power is approximately the same in all channels. An information-bearing signal $s(t)$ is discernible by one or more distinguishing characteristics such as, e.g., a waveform of generally greater amplitude when information appears simultaneously with a noise signal $n(t)$. The total signal $x(t)$ on a given channel i comprises the sum of noise $n(t)$ and information $s(t)$. For purposes of measurement, time is divided into subintervals, or epochs, of duration T. Information-bearing signal $s(t)$ is usually of finite duration and spans a number of epochs M. Assuming that an information signal $s(t)$ appears in an unpredictable epoch U, i.e., at the end of epoch U−1, and continues for M epochs, $$x_i(t) = s_i(t) + n_i(t) \text{ for } t_U \leq t < t_{U+M} \quad (1)$$
$$x_i(t) = n_i(t) \text{ for } t < t_U \text{ and for } t \geq t_{U+M}. \quad (2)$$

but on all other channels k, $$x_k(t) = n_k(t), \text{ for all } t \text{ and all } k; k \neq i. \quad (3)$$

It is unknown to an observer which channel will contain an information signal, at what time the signal will begin, and how long the signal will continue, i.e., i, U, and M are unknown.

FIG. 3 shows, as indicated by equation (1), a representative waveform 37 which includes noise, and an information-bearing channel signal at terminal 102 in FIG. 1, i.e., i=2, extending over M epochs of T-length intervals, beginning at the start $t_U$ of an unpredictable epoch U and ending at the end $t_{U+M}$ of an epoch U+M−1. Signal 37 is preceded in time by random noise 34 and followed by random noise 36, as indicated by equation (2).

In the FIG. 1 combining circuit, input signals of the C channels indicated are coupled through bandpass filters 201, 202, and 203. Those filters advantageously band-limit the respective channel signals to a band in which information signal energy is expected to be received. Band-limiting at least serves to reduce noise power outside the band of interest. The selected band may be the same for all channels, or different for each channel, depending upon the application in which the invention is used. For convenience of description, outputs of those filters are still represented as the signals $x_1(t)$, $x_2(t)$, and $x_C(t)$, and are coupled to a selector 120 over one of leads 104, 105, and 106. Selector 120, and another selector 118, to be mentioned, are advantageously circuit selection logic arrangements, or multiplexers, controlled by binary-coded input signals to select an analog signal input circuit, designated by the binary-coded signals, for connection to a common output circuit.

It is necessary to obtain an average of the signals in each channel over multiple epochs. However, voltage signals from filters 201–203 usually include both positive and negative portions with respect to ground, as illustrated in FIG. 3. Such signals are likely to have a low or zero average for noise and information over an interval of M epochs. The voltage signals are, therefore, advantageously converted to power level signals which can be averaged significantly. Accordingly, the outputs of filters 201–203 are coupled to individual power level monitors 107–109. Each of the monitors converts the received voltage signals of its channel to a corresponding power level value for each epoch. It has been found that the conversion is advantageously implemented by the integrated square of the channel signal voltage level. Thus, the power level $y_{c,m}$, in an arbitrary epoch m, and on an arbitrary channel c is $$y_{c,m} = \frac{1}{T} \int_{t_m}^{t_{m+1}} x^2_c(t) dt \quad (4)$$

Power level outputs are indicated at leads 110–112 in FIG. 1 for a particular epoch m. Each power level monitor implements equation (4) for its incoming channel.

Power magnitudes from the monitors are applied directly to averaging filters 113, 114, and 115, respectively, and over leads 110, 111, and 112, respectively, to a selector 118. The filters are advantageously digital filters. The filter functions each implement the following equation (5) for one of the channels to produce the result of summing the power level outputs over a sequence of P time epochs ending at the end of a current epoch m:

$$A_{c,m} = \frac{1}{P} \left[ \sum_{u=m-P+1}^{m} y_{c,u} \right] \quad (5)$$

That summation obtains an historical perspective of the signal state of each channel. P is of a duration much less than the length of typical expected information periods of M epochs. P is selected to yield, for any particular expected type of channel information signal, an advantageous compromise between so many epochs that the system starts slowly, and so few epochs that excessive numbers of false intervals of information signals are indicated. Stated differently, increasing the number of epochs P over which the statistical histories are accumulated has been found to increase the likelihood that the channel containing the information-bearing signal will be correctly selected. On the other hand, decreasing the value of P has been found to shorten the time to achieve steady state in an information signaling period. In one embodiment working 12 channels, a value of P=8 was found to produce satisfactory operation at a signal-to-noise power ratio of two decibels.

The averaged outputs $A_{c,m}$ are applied to inputs of a comparator 116. That comparator selects the channel having the largest average power, and outputs a binary-coded representation identifying that channel. Such a channel identification is herein designated a channel index $j_m$ for the case of the FIG. 1 illustration in which m indicates the current epoch. That comparison and identification function is advantageously implemented by successive, channel-pair, power level comparisons in which the channel level and index of the channel having the larger level are overwritten into a memory (not separately shown), and that level value used for the next successive comparison. The channel index saved after the last comparison for an epoch is that of the channel with the largest average power for the epoch m.

Once the channel bearing the largest signal is determined, its index is stored as $j_m$ in the upper register 119, of a push-down register stack, at the end of epoch m. At that time, an index $j_{m-1}$ from the prior epoch is pushed into lower stack register 121, and appears at ports B, D, and E. Port B (terminal 126) provides an observation port to identify the channel which had just previously had the strongest average signal, i.e., the index $j_{m-1}$ in register 121. The binary-coded index number $j_{m-1}$ output on port D is applied over lead 122 at that time, and sets a selector 118 to connect its output port A (terminal 125) to a suitable transducer, e.g., a strip-chart recorder, or display 130, to display, in epoch m, the power level of the channel that had been strongest in epoch m−1. The index number $j_{m-1}$ output occurring at the same time on port E is applied over lead 123 to set selector 120 to connect its output port C (terminal 127) to display the voltage magnitude of the signal incoming during the epoch m on the signal channel which had been strongest during epoch m−1.

The reason for displaying the signal occurring in the next epoch following the determination of the channel with the strongest history is to decouple the immediate signal state from, and maintain it statistically independent of, its history. This decoupling effect causes the actual selected channel output signal segment contributed to the combined output to be a segment that was not included in the selection-determining average, but which is likely to include significant information. The decoupling has been found to produce good contrast between output information and noise outputs in the time combined output at terminal 125 from monitors of the C channels when all are arrayed on another strip-chart display (not shown).

When only white noise is present on all channels, the selection of a given channel n as the strongest occurs with equal probability. The presence of an information signal on a particular channel i increases the likelihood of that channel being selected because, for example, the presence of both information and noise usually makes the total signal amplitude greater than the noise-only amplitude.

FIG. 4 shows, in a plot of selected channel i versus time, the results of a selection process in a four-channel system in which only one channel is likely to have an information-bearing signal at any given time. The horizontal line segments depicted in FIG. 4 represent binary-coded channel index values $j_{m-1}$ from register 121, that would be available at port B (terminal 126) of FIG. 1. During noise-only periods, represented by waves 34 and 36 in FIG. 3, selections of the channel of greatest output randomly, as indicated by traces 38 in FIG. 4. First, channel 3 is selected, then channel 2, then channel 1 for two consecutive epochs, and next channel 3 a second time to the left of the occurrence of the M-epoch information signal interval also indicated in FIG. 3. Similarly, in the noise-only interval on the right, traces 46 show random selection of channels 3, 4, 1, and 3. In the center of FIG. 4, after a spurious start-up interval in which channel 4 (trace 39) is chosen, a nearly continuous selection (shown by traces 43 and 44) of channel 2 results. Another spurious decision of channel 3 as the strongest channel is indicated by trace 45. Such an erroneous decision is to be expected occasionally in a practical system.

Figure 5:
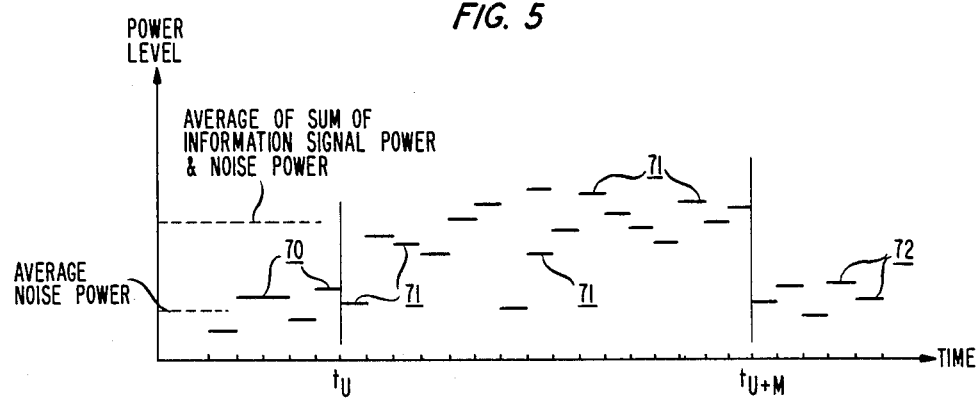

FIG. 5 portrays representative power level data that would be available at port A (terminal 125) during the corresponding epochs of FIGS. 3 and 4. In epochs containing noise only, the random selection of channels gives rise to a combined-signal average power level at port A approximately equal to that of the background noise power incoming on any of the input channels (traces 70 and 72). In epochs in which an information-bearing signal is present, the likely selection of channel 2 gives rise to an average power level which approximates the sum of the information signal power and the noise power (traces 71). Only a relatively modest increase in the average power level is needed to distinguish epochs containing an information signal from those containing noise only. It can be seen in FIG. 5 that the combined output power level segments are at approximately the average noise power level in the first and seventh epochs (corresponding to line segments 39 and 45 in FIG. 4). Correlating that with FIG. 4 indicates that those low outputs were from incorrect selection of channels 4 and 3, respectively.

Figure 6:
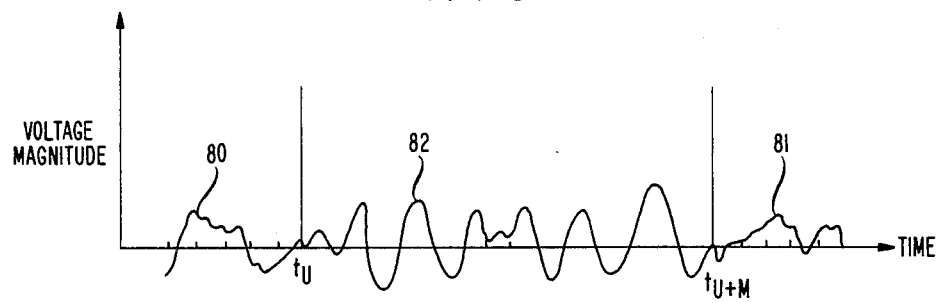

FIG. 6 portrays representative voltage magnitude combined output data that is available at port C (terminal 127) during the corresponding epochs of FIGS. 3 and 4. During noise-only epochs, the output at port C is a noise voltage (traces 80 and 81) with an average power level equal to that on any of the noise-only channels. In epochs in which an information-bearing signal is present, the output (trace 82) at port C is approximately equal to that information-bearing signal.

Figure 7:
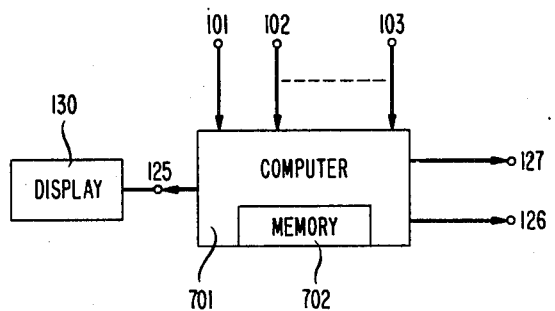
FIG. 7 is a diagram of an arrangement for implementing the invention using a computer.
Figure 8:
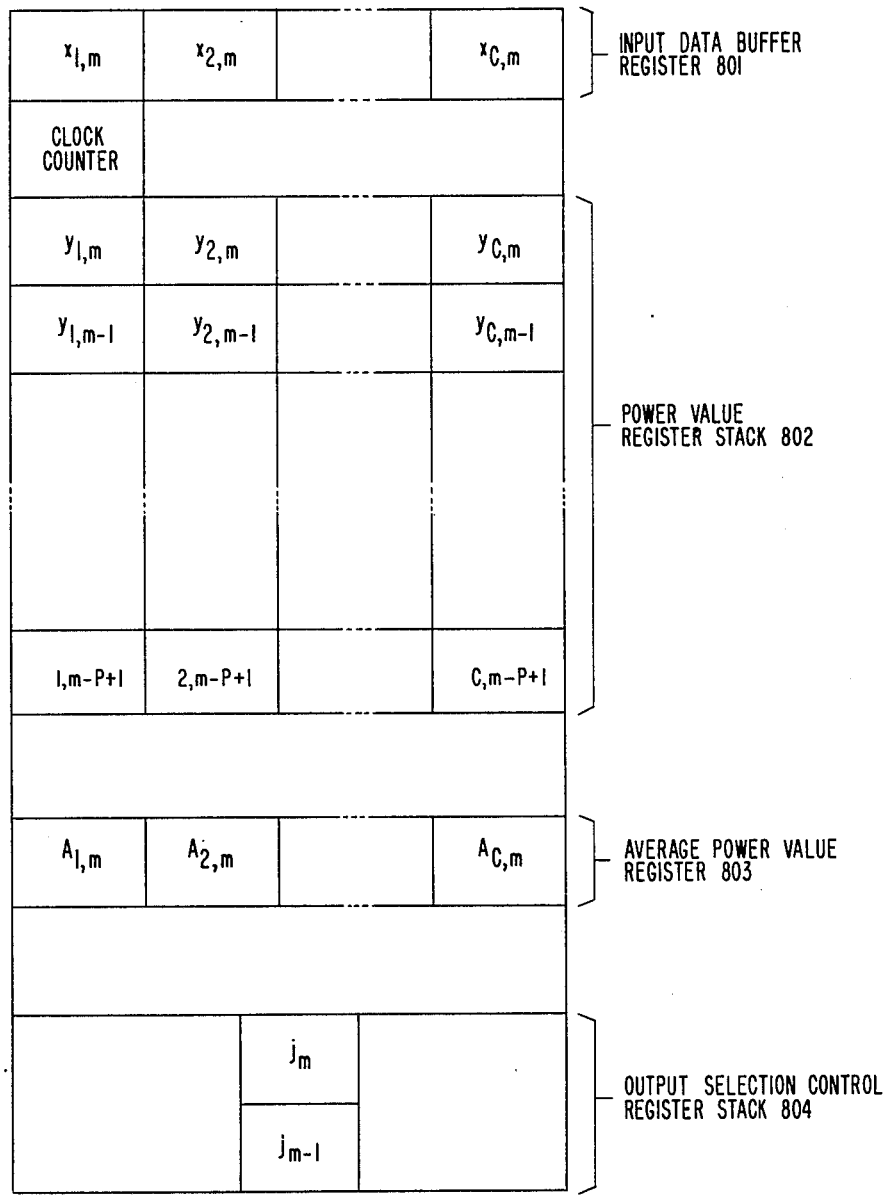
FIG. 8 is a partial memory map for the arrangement of FIG. 7.

FIGS. 7 and 8 depict the invention in terms of its software implementation in a digital computer 701, as previously mentioned. The computer 701 is connected to receive the same inputs at terminals 101–103 and produce the same outputs at terminals 125–127, as previously described in connection with FIG. 1. For purposes of description, all functions are assumed to be performed by the computer; but any one or more can, of course, be extracted for performance by separate hardware. FIG. 8 is a map of parts of the computer memory 702 space used for the process. FIG. 9 is a flow diagram of the process.

Input channel signals at terminals 101–103 are simultaneously sampled once per epoch at the Nyquist rate, the $u^{th}$ sample being taken at time $$t_u = \frac{u}{2W_{max}} \text{ (seconds)}, u = 1, 2, \ldots \quad (6)$$

where $W_{max}$ (Hz) is the maximum frequency in the band of interest.

FIG. 8 shows the storage used in this implementation and including:

(a) an input data buffer register (801) with C memory cells, i.e., one per channel;

(b) a push-down register stack (802) which is C memory cells wide and has a depth of P registers, to store historical power value information;

(c) a C memory cell register (803) for the average power values; and (d) a channel index push-down stack register (804), which is one memory cell wide, and has a depth of two registers used for output selection control.

In FIG. 9, the first operation is initialization, block 901, to set to zero all cells in storage registers 801–803 of FIG. 8. The top register of stack 804 is initially set to an arbitrary channel index, say 1; and the bottom register is set to zero. A clock counter register in FIG. 8 is set to one and will be used to count epochs for measuring the P-epoch averaging intervals.

Operations depicted in a process loop of FIG. 9 following initialization are performed during each epoch. An arbitrary epoch u begins at $t_u$ seconds and lasts until just prior to $t_{u+1}$ seconds. At time instant $t_m$, the beginning of the arbitrary current epoch m, the channels are simultaneously sampled. Each of these samples is quantized in an analog-to-digital converter operation, processed in a separate band-limiting filter operation corresponding to filters 201–203 in FIG. 1, and stored in digital form in the input data buffer 801 cell corresponding to its channel. The digital value so determined from an arbitrary channel c at time instant $t_m$ is denoted by $x_{c,m}$. FIG. 8 buffer register 801 shows the storage of the digital values $x_{1,m}, x_{2,m}, \ldots, x_{C,m}$, which were determined at time $t_m$ for samples from all of the input channels.

A power value is computed for each channel according to:

$$y_{c,m} = (x_{c,m})^2. \quad (7)$$

As these power values $y_{1,m}, y_{2,m}, \ldots, y_{C,m}$ are determined, they are pushed into the top register of stack 802. Data in other registers of stack 802 represent power values determined in the (P−1) previous clock cycles, and are pushed down correspondingly as new $y_{c,m}$ are entered.

The power values determined in the current clock cycle m and in the (P−1) previous clock cycles are summed, and normalized by the factor (1/P), to form average power values according to equation (5), which is reproduced here for the convenience of the reader:

$$A_{c,m} = \frac{1}{P}\left[\sum_{u=m-P+1}^{m} y_{c,u}\right] \quad (8)$$

The average power values $A_{1,m}, A_{2,m}, \ldots A_{C,m}$, determined during clock cycle m for all of the input channels, are stored in respective channel cells of register 803.

Average power values $A_{1,m}, A_{2,m}, \ldots, A_{C,m}$ are compared, for example, by pairwise successive comparisons, as already mentioned, to determine the largest value. The index $j_m$ of the channel in which this largest average power was determined is pushed into the upper register of the output selection control register stack 804. As a consequence, the index $j_{m-1}$ is pushed into the lower register of the stack.

The channel index $j_{m-1}$ is used to select the information to be output, e.g., to a display 130, for clock cycle m, from the data currently stored in the input data buffer 801 and in the top of stack 802. In particular, the digital voltage $x_{j_{m-1},m}$ is output at terminal 127 of FIG. 1. (This output data stream is processed through a digital-to-analog converter operation if analog reconstruction is necessary for the particular output application contemplated.) The power value $y_{j_{m-1},m}$ is output at terminal 125 of FIG. 1, and the index $j_{m-1}$ is output at terminal 126.

The clock cycle number m is incremented by one, and the FIG. 9 process loops to pass control to block 902.

To reduce the amount of storage in register stack 802, the computation of the average power values can be made according to a short form summation:

$$A_{c,m} = \alpha A_{c,m-1} + (1-\alpha)y_{c,m} \text{ for } c = 1, 2, \ldots, C. \quad (9)$$

where $\alpha$ is a constant greater than 0 and less than 1. One advantageous value is $\alpha = (P-1)/(P+1)$. If equation (8) is implemented, then only one register is needed in stack 802.

If more than one frequency of interest may be present in a single signal channel, e.g., in a spectrographic application, the channel signals from the single channel are all simultaneously applied to input leads 101, 102, and 103. In that case, the bandpass filters 201, 202, and 203 in FIG. 1 are assigned different center frequencies corresponding to the different frequencies of interest. Averaging filters 113–115 are correspondingly modified to average the power levels in their respective channels' passbands. Other circuits of FIG. 1 operate as described in connection with FIG. 1.

Figure 10:
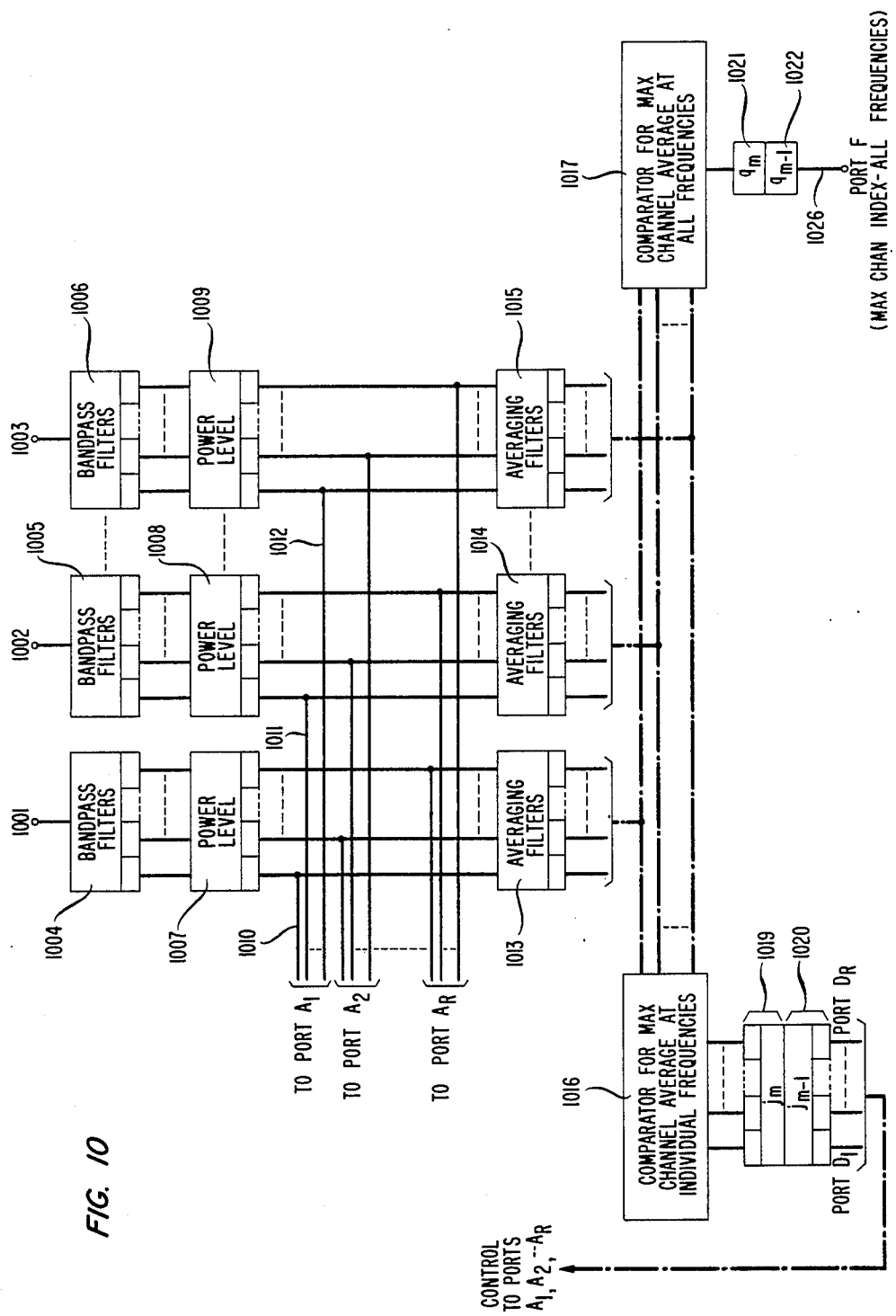
FIG. 10 is a functional diagram of an additional embodiment of the invention.

A computer-implemented version of the single-channel, multifrequency embodiment is similar to that already described in connection with FIGS. 8 and 9. A Fast Fourier Transform implementation of the bandpass filtering function is convenient in that case.

Where more than one frequency ($f_1 \ldots f_R$) of interest may be present within each of a plurality of channels being monitored, the respective channel signal processing functions of FIG. 1 are each expanded to provide R sets of such functions in the manner hereinbefore noted for the case of multiple frequencies on a single channel. This is illustrated in the functional block diagram of FIG. 10 in which output signal selector circuits 118 and 120 are omitted for convenience of illustration. FIG. 10 contemplates (a) an output lead 1026 (port F) for presenting in each epoch a binary-coded indicator of the single channel having the largest average power signal, regardless of frequency, and (b) a set of outputs (ports $D_1 \ldots D_R$), each including for each epoch a binary-coded indicator of the single channel having the largest average power signal at a corresponding one of the frequencies, respectively, of interest. Each such output ($D_1 \ldots D_R$) controls a separate selector (not shown), of the type previously indicated for selector 118, for selecting at a different one of the frequencies of interest (i.e., one of the ports $A_1$-$A_R$) the indicated power level monitor output.

Each chain of channel signal processing circuits for the respective channel inputs 1001–1003 is of the type previously described for the case of a multi-frequency, single-channel signal. Thus, filter banks 1004–1006, coupled to the respective wire channels, separate their channel signals into the desired frequency bands, or subchannels, centered on the frequencies $f_1 \ldots f_R$. Each of frequency subchannels driven from one of the wire channels is then applied, through a respective monitor of a corresponding one of the sets of power level monitors 1007–1009, to a respective filter of a corresponding one of the banks of power level averaging filters 1013–1015.

A bank of comparators 1016 each performs for a different one of frequencies $f_1$-$f_R$, across all channels, the largest-signal-selection-and-channel-indicating function already described in connection with comparator 116 with FIG. 1. Each of the comparators in bank 1016 provides a largest-signal-channel indicator $j_m$ for its frequency to a corresponding stack input register of an input register set 1019 of a bank of push-down register stacks. Those indicators are pushed down each epoch to provide the respective port $D_1 \ldots D_R$ binary-coded signals at output registers 1020 of the bank of push-down register stacks.

A comparator 1017 receives inputs from outputs of all filters of banks 1013–1015 to provide in each epoch a largest-signal, regardless of frequency, channel indicator $q_m$ to an input register 1021 of another push-down register stack. That indicator is pushed down in each epoch to provide the port F binary-coded signals $q_{m-1}$ at the output register 1022 of the stack. A computer-programmable process for the FIG. 10 embodiment is similar to the process of FIG. 9. Two main differences are noted. One is that, because of the large number of channels, i.e., plural wire channels each having plural frequency subchannels, a Fast Fourier Transform operation is advantageously employed for the bandpass filtering functions of filter banks 1004–1006. The second difference is, of course, the increase in the numbers of operations to be performed for each function block type because of the increased number of channels to be combined into a single output.

While this invention has been disclosed in terms of specific illustrative embodiments, other embodiments, modifications, and applications which will occur to those skilled in the art are included within the spirit and scope of the invention.

What is claimed is:

1. In a data signal combining arrangement for consolidating information signals from a plurality of signal channels into a single output signal, plural means, each responsive to signals of a different one of said channels, for averaging signal level for its one channel over a time interval comprising a fixed plurality of subintervals including a current subinterval, means, responsive to said averaging means for said plurality of channels, for ascertaining the channel having the largest average signal level in each subinterval, and means for outputting in a succeeding subinterval only a signal for that succeeding subinterval from one of said channels ascertained by said ascertaining means to have had the largest average signal level during said current subinterval.

2. The data signal combining arrangement in accordance with claim 1 in which there are provided means for determining the power level of signals occurring in successive time subintervals on each of said plurality of channels, and said averaging means includes means for averaging signal power level for each channel over a plurality of subintervals including a current subinterval.

3. The data signal combining arrangement set forth in claim 1 in which said outputting means comprises means for storing, in each time subinterval, a channel index of said one channel, and means, responsive in said succeeding subinterval to said index of said one channel, for outputting signal from said one channel.

4. The data signal combining arrangement set forth in claim 3 in which said outputting means comprises means, responsive to said one channel index, for outputting an unaveraged signal level of said strongest channel.

5. The data signal combining arrangement set forth in claim 3 in which said outputting means comprises means for selecting signals from one of said channels at a point in said one channel prior to said averaging means, and means, responsive to said channel index, for controlling said selecting means.

6. The data signal combining arrangement set forth in claim 5 in which said outputting means further comprises means, responsive to said channel index, for outputting an unaveraged signal level of said strongest channel.

7. In a data signal combining arrangement, the method for consolidating information signals from a plurality of signal channels into a single output signal train, said method comprising the steps of averaging levels of signals for each channel, respectively, over an interval comprising a predetermined plurality of subintervals including a current subinterval, in each subinterval, ascertaining, from the averages of signal levels of the respective channels obtained in said averaging step, the channel having the largest average signal level, and outputting in a succeeding subinterval only the unaveraged channel signal level then occurring in the channel identified as having had the largest average signal in said current subinterval.

8. The signal consolidating method in accordance with claim 7 in which said averaging step includes a step of averaging power levels of signals for each channel.

* * * * *